(12) United States Patent
Ju

(10) Patent No.: US 9,468,996 B2
(45) Date of Patent: Oct. 18, 2016

(54) METHOD OF REPAIRING SUBSTRATE

(71) Applicant: Samsung Display Co., Ltd., Yongin-si, Gyeonggi-do (KR)

(72) Inventor: Sung Bae Ju, Hwaseong-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 520 days.

(21) Appl. No.: 13/957,585

(22) Filed: Aug. 2, 2013

(65) Prior Publication Data

US 2014/0182104 A1     Jul. 3, 2014

(30) Foreign Application Priority Data

Jan. 3, 2013  (KR) .................. 10-2013-0000705

(51) Int. Cl.
| | | |
|---|---|---|
| *B23P 6/00* | (2006.01) | |
| *B23K 26/36* | (2014.01) | |
| *H01L 21/268* | (2006.01) | |
| *B23K 26/00* | (2014.01) | |
| *B23K 26/40* | (2014.01) | |

(52) U.S. Cl.
CPC .............. *B23P 6/00* (2013.01); *B23K 26/0006* (2013.01); *B23K 26/0081* (2013.01); *B23K 26/36* (2013.01); *B23K 26/362* (2013.01); *B23K 26/40* (2013.01); *H01L 21/268* (2013.01); *B23K 2203/172* (2015.10); *B23K 2203/50* (2015.10); *Y10T 29/49728* (2015.01)

(58) Field of Classification Search
CPC ....... H01L 21/00; H01L 21/70; B23K 26/36; B23K 26/365
USPC ....... 438/166, 795, 486; 219/121.68, 121.69, 219/121.85; 29/402.07, 825, 846
See application file for complete search history.

(56) References Cited

U.S. PATENT DOCUMENTS

2004/0266079 A1*  12/2004  Shimomura ....... B23K 26/0732
                                                     438/166
2009/0058764 A1*   3/2009  Imai ................... G02F 1/136259
                                                     345/55

FOREIGN PATENT DOCUMENTS

KR    10-2003-0000411      1/2003
KR    10-2004-0059821      7/2004

* cited by examiner

*Primary Examiner* — Samuel M Heinrich
(74) *Attorney, Agent, or Firm* — Robert E. Bushnell, Esq.

(57) ABSTRACT

A method of repairing a substrate that may prevent a metal layer from being corroded. A substrate including a metal layer and an insulating layer on the metal layer is first provided. Then, a laser beam having a wavelength range having a high transmittance with respect to the insulating layer is irradiated to selectively remove a portion of the metal layer. Also, a first laser beam is irradiated to remove a portion of the metal layer and a portion of the insulating layer, and then a second laser beam is irradiated onto side surfaces of the exposed insulating layer to melt the insulating layer, thereby forming a corrosion preventing layer covering the metal layer.

15 Claims, 5 Drawing Sheets

METHOD OF REPAIRING SUBSTRATE

CLAIM PRIORITY

This application makes reference to, incorporates the same herein, and claims all benefits accruing under 35 U.S.C. §119 from an application earlier filed in the Korean Intellectual Property Office on 3 Jan. 2013 and there duly assigned Ser. No. 10-2013-0000705.

BACKGROUND OF THE INVENTION

1. Field of the Invention

The present invention generally relates to a method of repairing a substrate.

2. Description of the Related Art

The present disclosure herein relates to a method of repairing a substrate, and more particularly, to a method of repairing a substrate using laser beam.

The above information disclosed in this Related Art section is only for enhancement of understanding of the background of the invention and therefore it may contain information that does not form the prior art that is already known to a person of ordinary skill in the art.

SUMMARY OF THE INVENTION

The present disclosure provides methods of repairing a substrate that may selectively remove a portion of a short-circuited metal layer without having an influence on another layer.

The present disclosure also provides methods of repairing a substrate that may prevent corrosion of a metal layer exposed after a short-circuited portion between metal layers and an insulating layer are removed.

Embodiments of the inventive concept provide methods of repairing a substrate including: providing a substrate including a metal layer and an insulating layer on the metal layer; and irradiating a laser beam of a first wavelength range in a perpendicular to the substrate to selectively remove a portion of the metal layer.

In some embodiments, the laser beam may be irradiated until the temperature of the metal layer arrives at least at a melting point of the metal layer.

In other embodiments, the laser beam may be irradiated using a wavelength variable solid laser.

In still other embodiments, the insulating layer may be made of a silicon-based material, for example, silicon oxide. In even other embodiments, the first wavelength range is about 2-6 μm.

In other embodiments of the inventive concepts, methods of repairing a substrate include: providing a substrate including a metal layer and an insulating layer on the metal layer; irradiating a first laser beam in a perpendicular to the substrate to selectively remove a portion of the metal layer and a portion of the insulating layer; and irradiating a second laser beam onto a side surface of the insulating layer to form a corrosion preventing layer covering the side surface of the insulating layer.

In some embodiments, the metal layer may be made of a metal having a melting point higher than the insulating layer.

In other embodiments, the second laser beam may be irradiated until at least the temperature of the insulating layer arrives at the melting point of the insulating layer and before at least the temperature of the metal layer arrives at the melting point of the metal layer.

In still other embodiments, the second laser beam may be irradiated with a predetermined slope with respect to a direction perpendicular to the substrate. In even other embodiments, the second laser beam may be irradiated to form a closed loop on a plane along the side surface of the insulating layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE EMBODIMENTS

Figure 1:
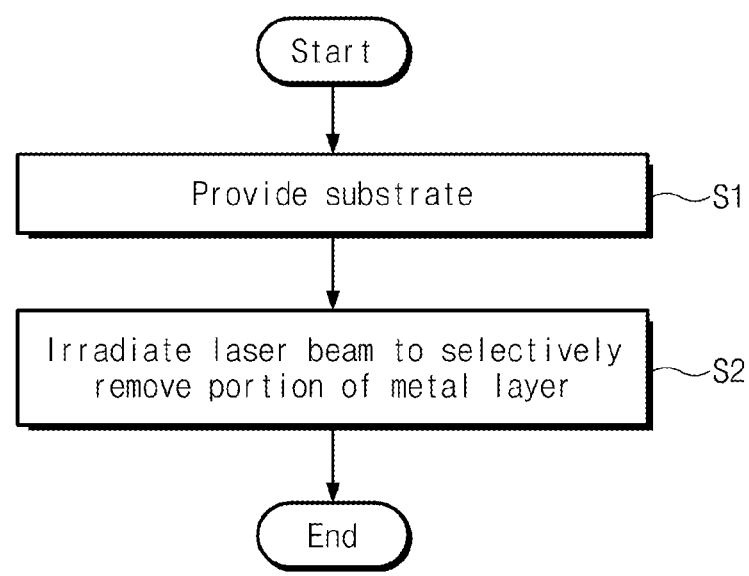
FIG. 1 is a flow diagram illustrating a substrate repairing method according to an embodiment of the inventive concept.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Generally, in forming displays and semiconductors, a metal layer is formed on a substrate and then an insulating layer is formed thereon. At this time, the metal layer may be used variously for a metal wiring, a metal pattern, etc.

In spite that the metal layer should be formed in plurality on the same layer and the plurality of metal layers should be electrically isolated according to circumstances, the plurality of metal layers may be short-circuited due to a process error.

To solve the above-mentioned problem, a method in which a laser beam is irradiated onto the substrate formed with the metal layer and the insulating layer to remove some of the short-circuited metal layer is used.

However, the existing method does not selectively remove only some of the short-circuited metal layer but also removes some of the insulating layer thereon together with the some of the metal layer. As a result, the metal layer may be unnecessarily exposed through the removed insulating layer and thus the exposed metal layer may be corroded.

Figure 2:
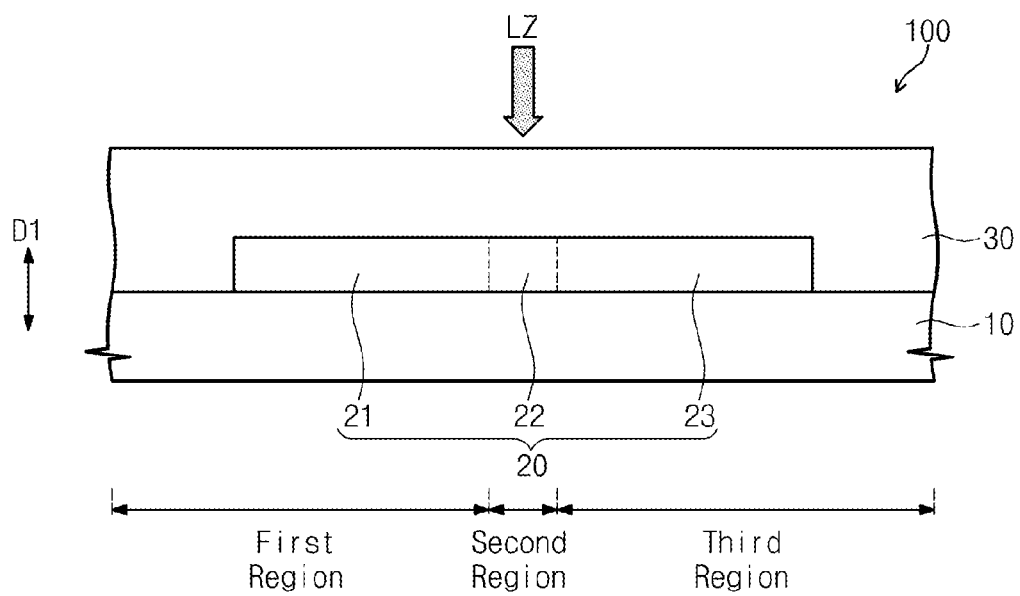
FIGS. 2 and 3 are cross-sectional views illustrating the substrate repairing method of FIG. 1.
Figure 3:
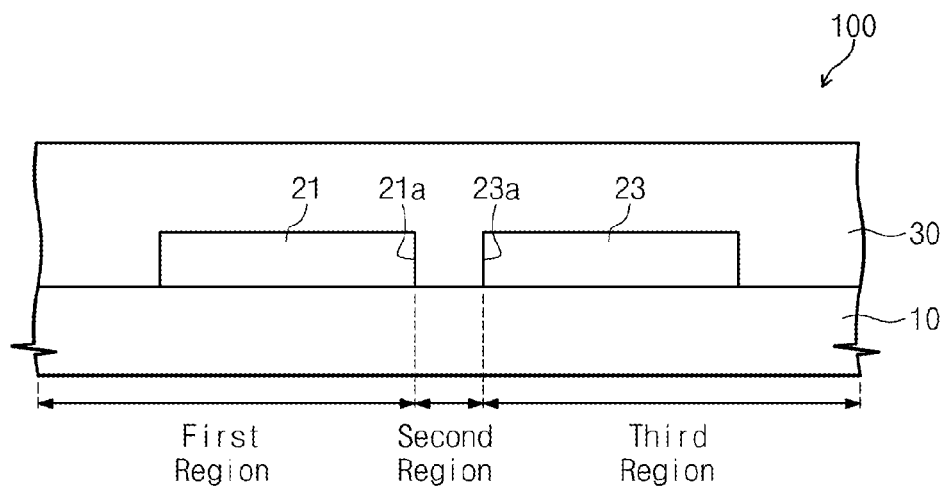

FIG. 1 is a flow diagram illustrating a substrate repairing method according to an embodiment of the inventive concept, and FIGS. 2 and 3 are cross-sectional views illustrating the substrate repairing method of FIG. 1.

Referring to FIGS. 1 and 2, in operation 51, a substrate 100 is first provided. The substrate 100 includes an insulating substrate 10, a metal layer 20, and an insulating layer 30.

The substrate 100 may include a first region, a second region and a third region. The second region may be disposed between the first region and the third region.

The metal layer 20 may be disposed on the insulating substrate 10. The metal layer 20 may include a first metal layer 21, a second metal layer 22, and a third metal layer 23. The first metal layer 21 may be a portion of the metal layer 20 corresponding to the first region, the second metal layer 22 may be a portion of the metal layer 20 corresponding to the second region, and the third metal layer 23 may be a portion of the metal layer 20 corresponding to the third region.

The first metal layer 21 and the third metal layer 23 may be short-circuited by the second metal layer 22.

The metal layer 20 may be used variously for a metal wiring, a metal pattern, etc. In an example, in the case where the metal layer 20 is a metal wiring, the first metal layer 21 and the third metal layer 23 are wirings to which different signals are applied, and the second metal layer 21 may be formed due to various reasons such as a process error, etc. to short-circuit the first metal layer 21 and the third metal layer 23. That is, the second metal layer 21 may be a configuration which should be removed so as to electrically and physically separate the first metal layer 21 and the third metal layer 23 from each other.

The insulating layer 30 may be formed on the metal layer 20 to cover the metal layer 20, thus isolating the metal layer 20 from an outside.

The insulating layer 30 may be a silicon-based material, for example, silicon oxide (SiOx), silicon nitride (SiNx), or the like. The silicon-based material is transparent and has a high insulation property so as to insulate the metal layer 20 from an outside.

Transmittance of light incident into silicon (Si) may be different according to the wavelengths. When the wavelength of light incident into silicon is about 4 μm, the incident light exhibits the highest transmittance. The silicon-based material contains silicon atoms as a main component and has a similar light transmittance characteristic to silicon. For example, when the wavelength of the incident light is about 2-6 μm, the silicon-based material has the highest light transmittance characteristic.

Although not illustrated in the drawings, at least one layer may be disposed between the insulating substrate 10 and the metal layer 20.

In operation S2, laser beam (LZ) is irradiated onto the substrate 100 in a direction (D1) perpendicular to the substrate 100 to selectively remove a portion of the metal layer 20.

At this time, the laser beam (LZ) may be irradiated by using a wavelength variable solid laser. Therefore, the wavelength of the laser beam (LZ) may be set to a range of about 2-6 μm that has a high transmittance with respect to the insulating layer 30.

The laser beam (LZ) may be irradiated onto the second region. The laser beam (LZ) passes through the insulating layer 30 in the second region and transfers energy to the second metal layer 22.

Since the second metal layer 22 has an inherent melting point, when the second metal layer 22 may be heated to a temperature of not less than the melting point thereof, the second metal layer 22 starts to be melted.

Since the temperature of the second metal layer 22 increases in proportion to the irradiation time of the laser beam (LZ), the laser beam (LZ) may be irradiated until the temperature of the second metal layer 22 arrives at the melting point of the metal layer 20. By maintaining the temperature of the second metal layer 22 at a temperature of not less than the melting point of the metal layer 20 through the irradiation of the laser beam (LZ) for a predetermined time, the second metal layer 22 may be selectively removed.

Referring to FIG. 3, it may be confirmed that the second metal layer 22 was removed by the laser beam (LZ).

According to the substrate repairing method in an embodiment of the inventive concept, only the second metal layer 22 may be selectively removed to electrically and physically separate the first metal layer 21 and the third metal layer 23 from each other. Since the insulating layer 30 is not changed, it continues to perform a role to insulate the first metal layer 21 and the third metal layer 23 from an outside. Also, since a side surface 21a of the first metal layer 21 and a side surface 23a of the third metal layer 23 which are exposed by the removed second metal layer 22 are isolated from an outside by the insulating layer 30, they are not corroded due to moisture.

Figure 4:
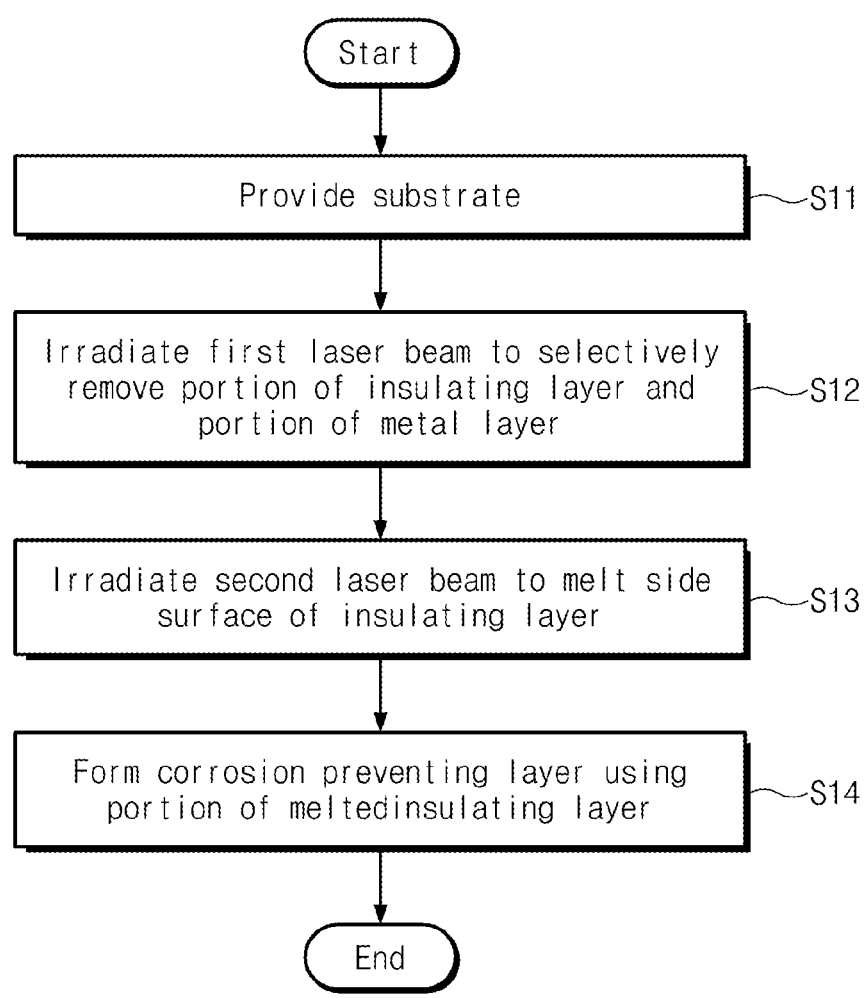
FIG. 4 is a flow diagram illustrating a substrate repairing method according to another embodiment of the inventive concept.
Figure 5:
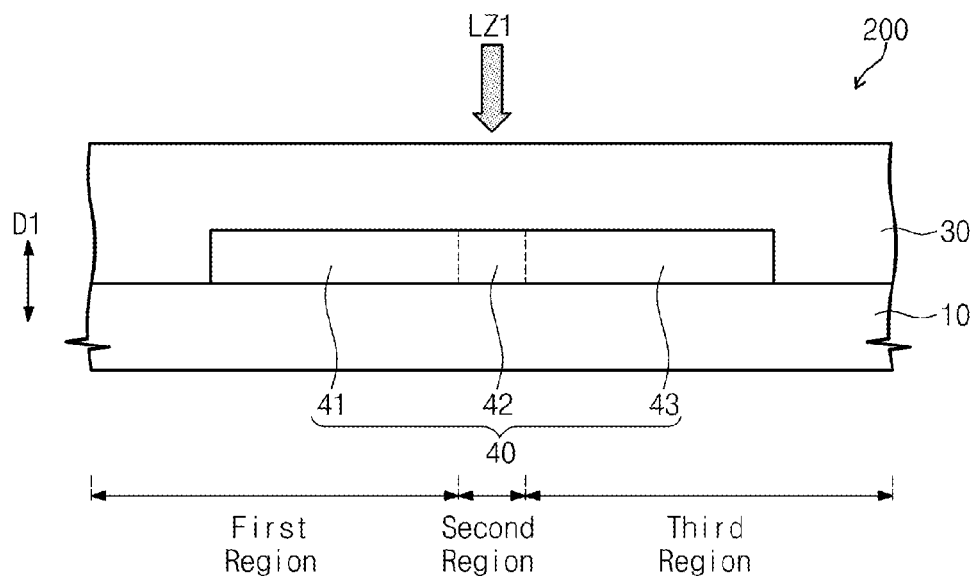
FIGS. 5, 6A and 7 are cross-sectional views illustrating the substrate repairing method of FIG. 4.
Figure 6A:
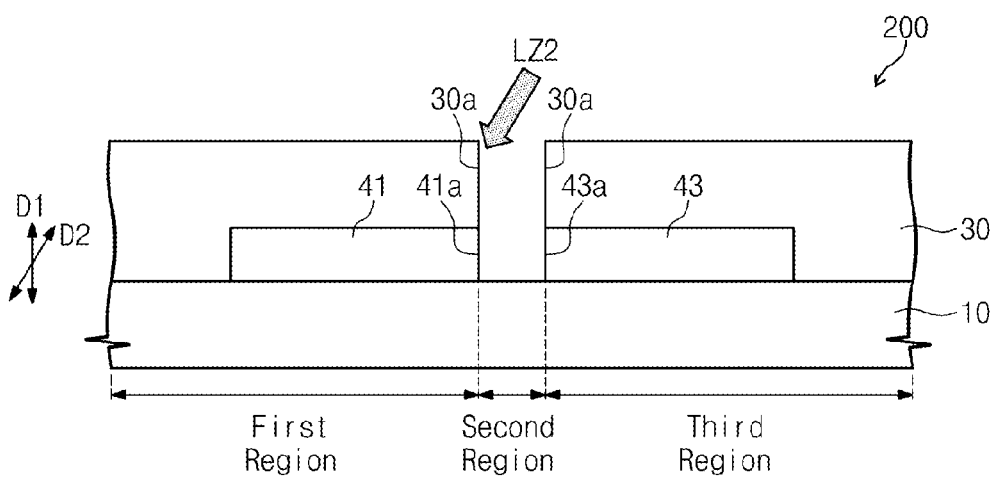
Figure 6B:
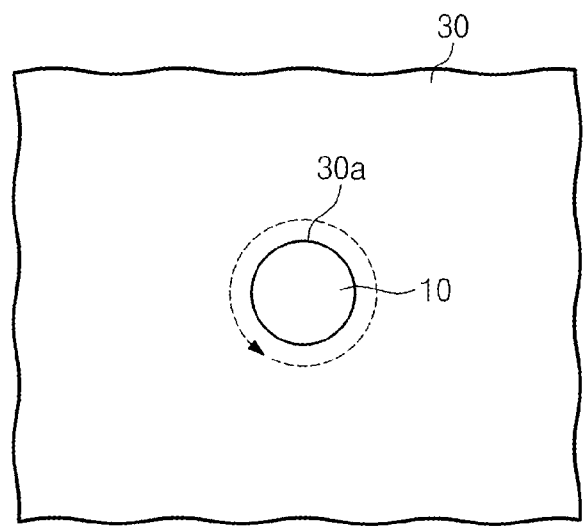
FIG. 6B is a plan view an irradiation path of a second laser beam.
Figure 7:
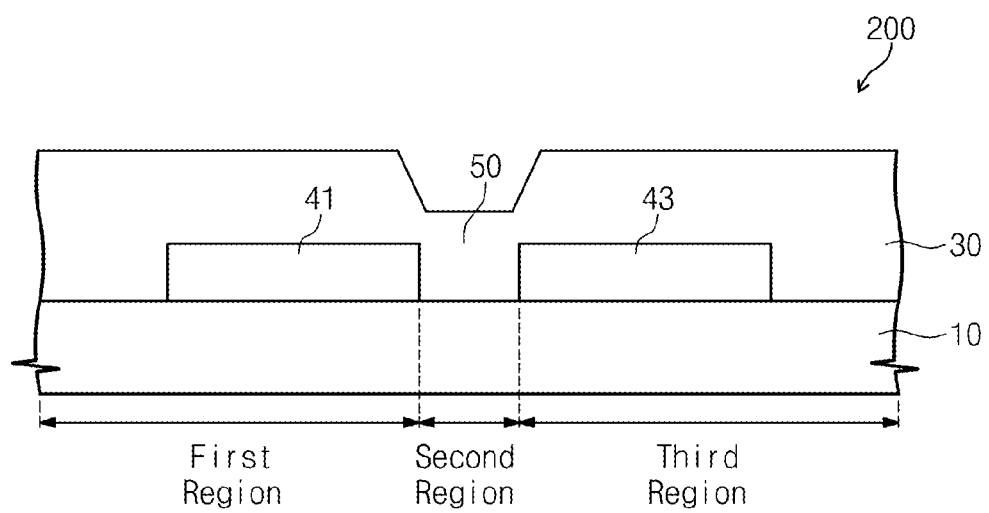

FIG. 4 is a flow diagram illustrating a substrate repairing method according to another embodiment of the inventive concept, FIGS. 5, 6A and 7 are cross-sectional views illustrating the substrate repairing method of FIG. 4, and FIG. 6B is a plan view an irradiation path of a second laser beam.

Referring to FIGS. 4 and 5, in operation S11, a substrate 200 is first provided. Since the substrate 200 is substantially the same as the substrate 100 in the previous embodiment described with reference to FIGS. 2 and 3 except for the material constituting a metal layer 40, like reference numerals are assigned to the remaining elements except for the metal layer 40, and detailed description thereof will be omitted.

The metal layer 40 may include a first metal layer 41, a second metal layer 42, and a third metal layer 43. The first metal layer 41 may be a portion of the metal layer 40 corresponding to the first region, the second metal layer 42 may be a portion of the metal layer 40 corresponding to the second region, and the third metal layer 43 may be a portion of the metal layer 40 corresponding to the third region.

The first metal layer 41 and the third metal layer 43 may be short-circuited by the second metal layer 42.

The metal layer 40 may be used variously for a metal wiring, a metal pattern, etc. In an example, in the case where the metal layer 40 is a metal wiring, the first metal layer 41 and the third metal layer 43 are wirings to which different signals are applied, and the second metal layer 42 may be formed due to various reasons such as a process error, etc. to short-circuit the first metal layer 41 and the third metal layer 43. That is, the second metal layer 42 may be a configuration which should be removed so as to electrically and physically separate the first metal layer 41 and the third metal layer 43 from each other.

The metal layer 40 may be formed of a metal having a higher melting point than the insulating layer 30, for example, chromium (Cr).

Also, the metal layer 40 may be formed in a plurality of layers. When the metal layer 40 is formed in a plurality of layers, the layer, among the plurality of metal layers, contacting the insulating layer 30 may be made of a metal having a higher melting point than the insulating layer 30.

Thereafter, a first laser beam (LZ1) may be irradiated onto the substrate 200 in a direction perpendicular to the substrate 200 to selectively remove some of the metal layer 40 and some of the insulating layer 30.

At this time, the first laser beam (LZ1) may be irradiated to the second region. The first laser beam (LZ1) transfers energy to some of the insulating layer 30 and some of the metal layer 40 which are on a traveling path thereof.

Referring to FIG. 6A, some of the insulating layer 30 and the second metal layer 42 corresponding to the second region are removed by the first laser beam (LZ1), so that a side surface 30a of the insulating layer 30, a side surface 41a of the first metal layer 41 and a side surface 43a of the third metal layer 43 are exposed.

Thereafter, in operation S13, a second laser beam (LZ2) may be irradiated onto the side surface 30a of the insulating layer 30 to melt the side surface 30a of the insulating layer 30.

The second laser beam (LZ2) may be irradiated with a direction (D2) inclined by a predetermined angle with respect to a direction (D1) perpendicular to the substrate 200. This operation may be performed to precisely irradiate the second laser beam (LZ2) onto the side surface 30a of the insulating layer 30 and to increase the irradiation area of the second laser beam (LZ2).

Referring to FIG. 6B, the second laser beam (LZ2) may be irradiated so as to form a closed loop along the side surface 30a of the insulating layer 30 in the inclined direction (D2) on a plane. The dotted line of FIG. 6B may be an irradiation path of the second laser beam (LZ2). By doing so, the second laser beam (LZ2) may be irradiated to all the side surfaces 30a of the insulating layer 30. In the case where the insulating layer 30 and the second metal layer 42 are removed in a circular form on a plane by the first laser beam (LZ1) as illustrated in FIG. 6B, the second laser beam (LZ2) may be irradiated in a circular form along the side surface 30a of the insulating layer 30.

The second laser beam (LZ2) may be irradiated until at least the temperature of the side surface 30a of the insulating layer 30 arrives at the melting point of the insulating layer 30 and before at least the temperatures of the side surface 41a of the first metal layer 41 and the side surface 43a of the third metal layer 43 arrive at the melting point of the metal layer 40.

Since the temperature rise of a material by irradiation of the second laser beam (LZ2) may be determined by variables, such as the wavelength and the irradiation time of the second laser beam (LZ2), the insulating layer 30 may be selectively melted by controlling these variables.

The first laser beam (LZ1) and the second laser beam (LZ2) may be irradiated by using a wavelength variable solid laser. The first laser beam (LZ1) and the second laser beam (LZ2) are irradiated in a condition that at least one of wavelength and irradiation time may be different from each other. This is because the first laser beam (LZ1) should melt both of the insulating layer 30 and the metal layer 40, and the second laser beam (LZ1) should selectively melt only the insulating layer 30 as described above.

Referring to FIG. 7, in operation S14, a corrosion preventing layer 50 covering the exposed side surface 41a of the first metal layer 21 and the exposed side surface 43a of the third metal layer 43 may be formed by using the side surface 30a of the insulating layer 30 remaining after the melting.

Some of the insulating layer 30 remaining after the melting may be melted by the second laser beam (LZ2) to fill a space between the side surface 41a of the first metal layer 41 and the side surface 43a of the third metal layer 43, thereby forming the corrosion preventing layer 50. Since the corrosion preventing layer 50 may be formed by melting the insulating layer 30, the corrosion preventing layer 50 may be made of the same material as the insulating layer 30.

The corrosion preventing layer 50 covers at least the side surface 41a of the first metal layer 41 and the side surface 43a of the third metal layer 43. In FIG. 7, it is exemplarily illustrated that the corrosion preventing layer 50 covers the side surface 41a of the first metal layer 41, the side surface 43a of the third metal layer 43, and a top surface of the insulating substrate 10. However, the inventive concept is not limited thereto. For example, if the corrosion preventing layer 50 may cover the side surface 41a of the first metal layer 41 and the side surface 43a of the third metal layer 43 by controlling the melting amount of the insulating layer 30, the top surface of the insulating substrate 10 may be partially exposed.

According to the substrate repairing method in another embodiment of the inventive concept, by forming the corrosion preventing layer 50, the side surfaces of the first metal layer 41 and the third metal layer 43 which are exposed in the course of electrically and physically separating the first metal layer 41 and the third metal layer 43 may be insulated from an outside. Therefore, the side surfaces of the first metal layer 41 and the third metal layer 43 are not corroded due to moisture.

As described above, according to the substrate repairing method in an embodiment of the inventive concept, some of a short-circuited metal layer may be selectively removed without causing a variation in an insulating layer by irradiating a laser beam.

According to the substrate repairing method in another embodiment of the inventive concept, after a short-circuited metal layer and an insulating layer are removed, the insulating layer may be selectively melted to form a corrosion preventing layer covering the exposed metal layer, thereby preventing corrosion of the metal layer.

While this invention has been particularly shown and described with reference to preferred embodiments thereof, it will be understood by those skilled in the art that various changes in form and details may be made therein without departing from the spirit and scope of the invention as defined by the appended claims. Therefore, embodiments should be considered in descriptive sense only and not for purposes of limitation.

What claimed is:

1. A method of repairing a substrate, the method comprising:
   providing a substrate including a metal layer and an insulating layer in direct contact with the metal layer; and
   irradiating a laser beam having a first wavelength range in a direction perpendicular to the substrate to selectively remove a portion of the metal layer while leaving the insulating layer intact.

2. The method of claim 1, wherein the laser beam is irradiated until at least the temperature of the metal layer arrives at a melting point of the metal layer.

3. The method of claim 1, wherein the metal layer comprises a first meta layer, a second metal layer and a third metal layer,
   the first metal layer and the third metal layer are short-circuited by the second metal layer, and
   the laser beam is irradiated to remove the second metal layer.

4. The method of claim 1, wherein the laser beam is irradiated using a wavelength variable solid laser.

5. The method of claim 1, wherein the insulating layer is made of a silicon based material.

6. The method of claim 5, wherein the insulating layer is made of silicon oxide.

7. The method of claim 6, wherein the first wavelength range is about 2-6 μm.

8. A method of repairing a substrate, the method comprising:
   providing a substrate including a metal layer and an insulating layer on the metal layer;
   irradiating a first laser beam in a direction perpendicular to the substrate to selective remove a portion of the metal layer and a portion of the insulating layer;
   irradiating a second laser beam onto a side surface of the exposed insulating layer to melt the side surface of the insulating layer; and
   forming a corrosion preventing layer covering the side surface of the insulating layer by using some of the melted insulating layer.

9. The method of claim 8, wherein the metal layer is made of a metal having a melting point higher than the insulating layer.

10. The method of claim 9, wherein the second laser beam is irradiated until at least the temperature of the insulating layer arrives at the melting point of the insulating layer and before at least the temperature of the metal layer arrives at the melting point of the metal layer.

11. The method of claim 8, wherein the insulating layer is made of a silicon based material.

12. The method of claim 11, wherein the insulating layer is made of silicon oxide.

13. The method of claim 8, wherein the second laser beam is irradiate with a predetermined slope with respect to a direction perpendicular to the substrate.

14. The method of claim 12, wherein the second laser beam is irradiated to form a closed loop on a plane along the side surface of the insulating layer.

15. The method of claim 8, wherein the metal layer comprises a first metal layer, a second metal layer and a third metal layer,
   the first metal layer and the third metal layer are short-circuited by the second metal layer, and
   the first laser beam is irradiated to remove the second metal layer and a portion of the insulating layer corresponding to the second metal layer.

* * * * *